United States Patent [19]
Bandyopadhyay et al.

[11] Patent No.: US 6,309,947 B1
[45] Date of Patent: *Oct. 30, 2001

(54) METHOD OF MANUFACTURING A SEMICONDUCTOR DEVICE WITH IMPROVED ISOLATION REGION TO ACTIVE REGION TOPOGRAPHY

(75) Inventors: Basab Bandyopadhyay; Douglas J. Bonser, both of Austin, TX (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/944,314

(22) Filed: Oct. 6, 1997

(51) Int. Cl.$^7$ .................................................. H01L 21/762
(52) U.S. Cl. ......................... 438/424; 438/692; 438/734
(58) Field of Search ........................... 438/424, 435, 438/437, 692, 700, 734, FOR 111, FOR 227

(56) References Cited

U.S. PATENT DOCUMENTS

| | | | |
|---|---|---|---|
| 4,666,556 | * | 5/1987 | Fulton et al. . |
| 5,229,316 | * | 7/1993 | Lee et al. . |
| 5,256,593 | * | 10/1993 | Iwai . |
| 5,298,010 | * | 3/1994 | Schoenborn et al. . |
| 5,316,965 | * | 5/1994 | Philipossian et al. . |
| 5,492,858 | * | 2/1996 | Bose et al. . |
| 5,498,565 | * | 3/1996 | Gocho et al. . |
| 5,677,233 | * | 10/1997 | Abiko . |
| 5,866,465 | * | 2/1999 | Doan et al. . |

OTHER PUBLICATIONS

Wolf, S. et al., Silicon Processing For the VLSI Era: vol. 1, Process Technology, Lattice Press, pp. 550–554, 1986.*
Wolf, S., Silicon Processing For the VLSI Era: vol. 2, Process Integration, Lattice Press, pp. 54–56, 1986.*
Wolf, "Chapter 2: Isolation Technologies for Integrated Circuits", Silicon Processing for the VLSI Era—vol. 2—Process Integration, pp. 12–66 (1990).

* cited by examiner

Primary Examiner—George Fourson

(57) ABSTRACT

A method of making a semiconductor device with improved isolation region to active region topography includes forming a masking layer on a surface of a substrate. A portion of the masking layer is removed to define one or more field regions and at least one trench is formed in the one or more field regions. An oxide layer is formed which substantially fills the trench and then a portion of the oxide layer is removed to leave the oxide layer with a relatively planar surface that is recessed with respect to the masking layer. The masking layer is then removed to expose the substrate. There may be a height differential between the substrate surface and the relatively planer surface of the oxide layer, however, the height differential is substantially less than the thickness of the masking layer.

19 Claims, 7 Drawing Sheets

METHOD OF MANUFACTURING A SEMICONDUCTOR DEVICE WITH IMPROVED ISOLATION REGION TO ACTIVE REGION TOPOGRAPHY

FIELD OF THE INVENTION

The present invention is directed generally to a method of manufacturing a semiconductor device and, more particularly, to a method of manufacturing a semiconductor device with improved isolation region to active region topography.

BACKGROUND OF THE INVENTION

Over the last few decades, the electronics industry has undergone a revolution through the use of semiconductor technology to fabricate small, highly integrated electronic devices. The most common semiconductor technology presently used is silicon-based. A large variety of semiconductor devices have been manufactured having various applications in numerous disciplines. Such silicon-based semiconductor devices often include metal-oxide-semiconductor (MOS) transistors, complimentary MOS (CMOS) transistors, bipolar transistors, bipolar CMOS (BiCMOS) transistors, etc.

Each of these semiconductor devices generally includes a semiconductor substrate on which a number of active devices are formed. The particular structure of a given active device can vary between device types. For example, in MOS transistors, an active device generally includes source and drain regions and a gate electrode which modulates current between the source and drain regions. In bipolar transistors, an active device generally includes a base, a collector, and an emitter.

Semiconductor devices, like the ones mentioned above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

One important step in the formation of semiconductors is the process of electrically isolating adjacent active devices. One known technique for isolating active devices on a semiconductor substrate is LOCOS (LOCal Oxidation of Silicon) isolation. LOCOS isolation generally involves the formation of a recessed or semi-recessed oxide 20 in the nonactive (or field) areas 22 of a substrate 24 which separate the active devices 26, as illustrated in FIG. 1A.

In one particular LOCOS process, a thin silicon dioxide layer, often referred to as a pad oxide layer is grown on the surface of a semiconductor substrate. A relatively thick layer of silicon nitride is then deposited over the pad oxide layer. Using a mask and etch process, the pad oxide/nitride layers are then selectively removed to define active regions (generally those regions masked by the pad oxide/nitride layers) and field regions (generally those regions over which the pad oxide/nitride layers have been removed). The nitride layer acts as a mask during subsequent oxide growth. An oxide, typically referred to as a field oxide, is thermally grown in the field regions to a thickness ranging from 0.3 to 1.0 $\mu$m to electrically isolate the active regions. The pad oxide layer and nitride masking layer are then removed to expose the active regions of the substrate.

The structure resulting from LOCOS isolation techniques is typically associated with a number of limitations. One limitation in particular is the poor planarity of the resultant surface topography. This limits the maximum resolution of photolithography steps and serves to further impede scaling down of semiconductor devices.

One alternative to LOCOS isolation is trench isolation. A typical device utilizing trench isolation is illustrated in FIG. 1B. Trench isolation generally involves covering the substrate 24 with a masking layer 27 which is then patterned and etched to expose one or more field regions 22. Shallow trenches 28 are etched in the field regions 22 of the substrate 24 and the trenches 28 are refilled with a silicon dioxide layer 30, which is etched back to form a relatively planar surface with masking layer 27. The masking layer 27 is then removed. While trench isolation generally improves the planarity of the surface topography of the device, there is usually a height differential 32 between the source/drain regions 26 and the field regions 22. The height differential 32 is approximately equal to the size of the masking layer 27. Typical masking layer thicknesses range from about 1000–2000 angstroms or more. Reducing the size of the masking layer 27, however, reduces its ability to protect the substrate below and may make the timing of the polishing process less flexible. A more detailed discussion of the LOCOS and trench isolation techniques as well as the advantages and disadvantages resulting therefrom can be found in S. Wolf, *Silicon Processing For The VLSI Era*, Vol. 2: Processing Integration, Chap. 2, pp. 12–66, 1990.

SUMMARY OF THE INVENTION

Generally, the present invention relates to a method of manufacturing a semiconductor device with improved isolation region to active region topography. One embodiment is a method of making a semiconductor device. A masking layer is formed on a surface of a substrate. A portion of the masking layer is removed to define one or more field regions and at least one trench is formed in the field regions. An oxide layer is formed in the trench to substantially fill the trench. A portion of the oxide layer is removed to leave the oxide layer with a relatively planar surface that is recessed with respect to the masking layer. The masking layer is then removed to expose the substrate. A height differential may exist between the surface of the substrate surface and the relatively planar surface of the remaining portion of the oxide layer. The height differential, generally, is substantially less than the thickness of the masking layer.

In accordance with another embodiment of the invention, the oxide layer is removed in two stages. A first portion of the oxide layer is removed to form a surface of the oxide layer which is relatively planar with the masking layer. Subsequently, a second portion of the oxide layer is removed to leave a remaining portion of the oxide layer which has a relatively planar surface and is recessed with respect to the masking layer.

A further embodiment of the invention is another method of making a semiconductor device. A first masking layer is formed on a surface of a substrate. A portion of the first masking layer is selectively removed to define one or more field regions and one or more trenches are formed in the field regions. An oxide layer is formed which substantially fills the trenches. A second masking layer is then formed over the oxide layer and a portion of the second masking layer is selectively removed to expose a first portion of the oxide layer. The exposed first portion of the oxide layer is then removed, followed by the removal of the second masking layer. A second portion of the oxide layer is then removed to leave the oxide layer with a relatively planar surface that is recessed with respect to the first masking layer. The first masking layer is then removed to expose the substrate and leave a height differential between the substrate surface and the relatively planar surface of the remaining portion of the oxide layer. The height differential, generally, is substantially less than the thickness of the first masking layer.

Another embodiment of the invention is a semiconductor device which includes a substrate, one or more trenches in the substrate, and an oxide material substantially filling the trenches. The oxide layer has a relatively planar surface which extends less than about 500 angstroms above the substrate surface adjacent to the trenches.

The above summary of the present invention is not intended to describe each illustrated embodiment or every implementation of the present invention. The Figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1A:
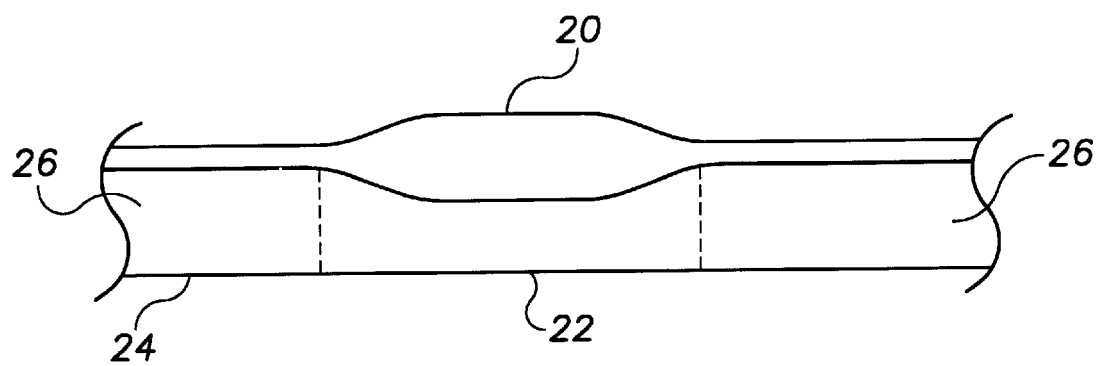
FIG. 1A illustrates a conventional LOCOS isolation region in a typical semiconductor device.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices which employ trench isolation regions to separate active device regions. While the present invention is not so limited, an appreciation of various aspects of the invention will be gained through a discussion of the fabrication process in connection with the examples provided below.

Figure 2A:
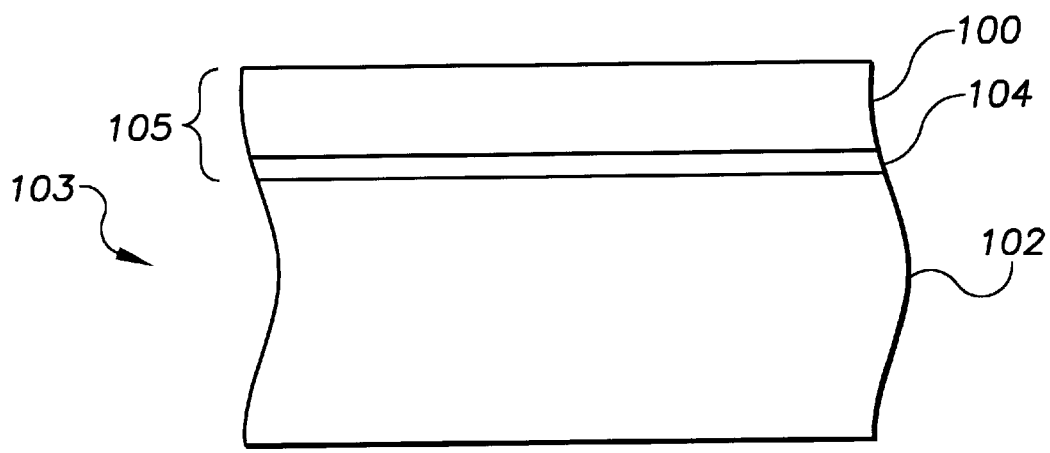
FIGS. 2A–2G illustrate an exemplary fabrication process in accordance with one embodiment of the invention.

FIGS. 2A–2G illustrate a process for fabricating a trench isolation region in a semiconductor substrate with the resultant semiconductor device having an improved surface topography between isolation and active regions. Using known techniques, a masking layer 100 is formed on a substrate 102 of a semiconductor wafer 103, as illustrated in FIG. 2A. An insulating layer 104 is often formed between the masking layer 100 and the substrate 102. The masking layer 100 and the insulating layer 104, if present, form a mask 105 which may be used to define isolation regions of the substrate 102.

The substrate 102 is typically formed from silicon, however, other materials may be used. The insulating layer 104 is usually an oxide, such as silicon dioxide, and is often referred to as a pad oxide. The masking layer 100 is generally formed from a material selective to oxide such as a nitride, for example, silicon nitride.

It will be appreciated that a number of different known fabrication techniques can be used to form the mask 105 depicted in FIG. 2A. For example, a thin (50–600 angstrom) layer of silicon dioxide may be thermally grown on the substrate 102 to form the insulating layer 104. A relatively thick (for example, 700–2500 angstroms) layer of silicon nitride may then be deposited on the insulating layer 104 to create the masking layer 100. The silicon nitride can be deposited by a variety of techniques, including, for example, chemical vapor deposition (CVD).

Figure 2B:
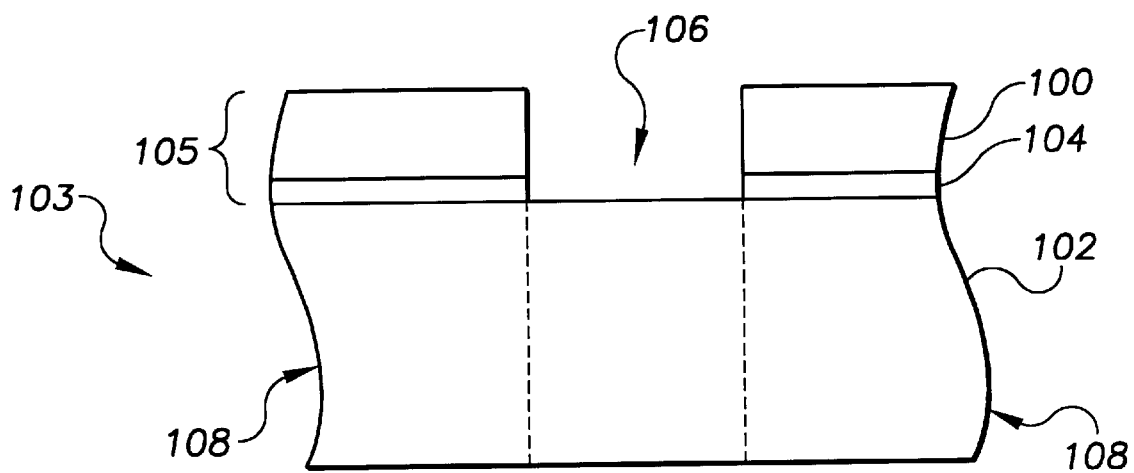

The masking layer 100 and the insulating layer 104 are selectively removed to expose the substrate 102 and define isolation regions 106 (e.g., field regions in a MOS device) which typically separate active regions 108 (e.g., source/drain regions in a MOS device) of the substrate 102. The resultant structure is illustrated in FIG. 2B. Selective removal of the masking layer 100 and the insulating layer 104 may be accomplished by, for example, standard photolithography and etching techniques.

Figure 2C:
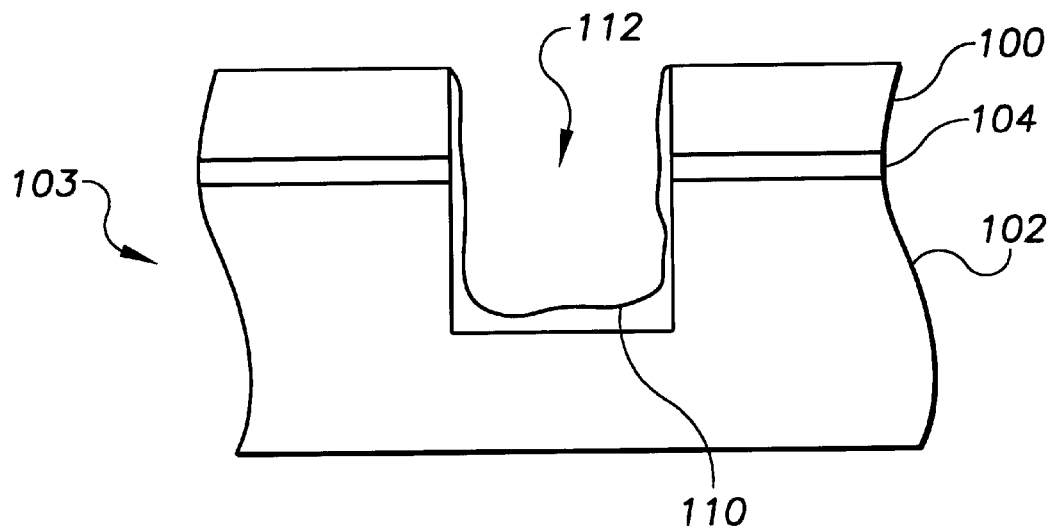

One or more trenches (only one of which is shown) are formed in the exposed regions of the substrate 102, as illustrated in FIG. 2C. The trench 110 may be formed using, for example, well-known etching methods and etchants. Ideally, the trench 110 has straight or slightly tapered sidewalls with rounded edges at the bottom of the trench. However, other trench configurations may be used. Typical trenches are between about 0.25–1.0 $\mu$m in width and about 0.2–0.5 $\mu$m in depth, but trenches with other dimensions may be formed. In one embodiment, a photoresist layer used to etch layers 100 and 104 may be left during trench formation. The photoresist may then be removed following the trench etch.

A relatively thin (300–800 angstrom) oxide layer 112 may be formed within the trench 110, as shown in FIG. 2C. In one particular embodiment, the thin oxide layer 112 is a thermal oxide layer formed, for example, using standard thermal oxidation techniques, such as the thermally controlled oxidation of silicon using gaseous $O_2$. The thin oxide layer 112 typically smoothes the edges and corners of the trench 110. In alternate embodiments, the formation of the thin oxide layer 112 may be omitted.

Figure 2D:
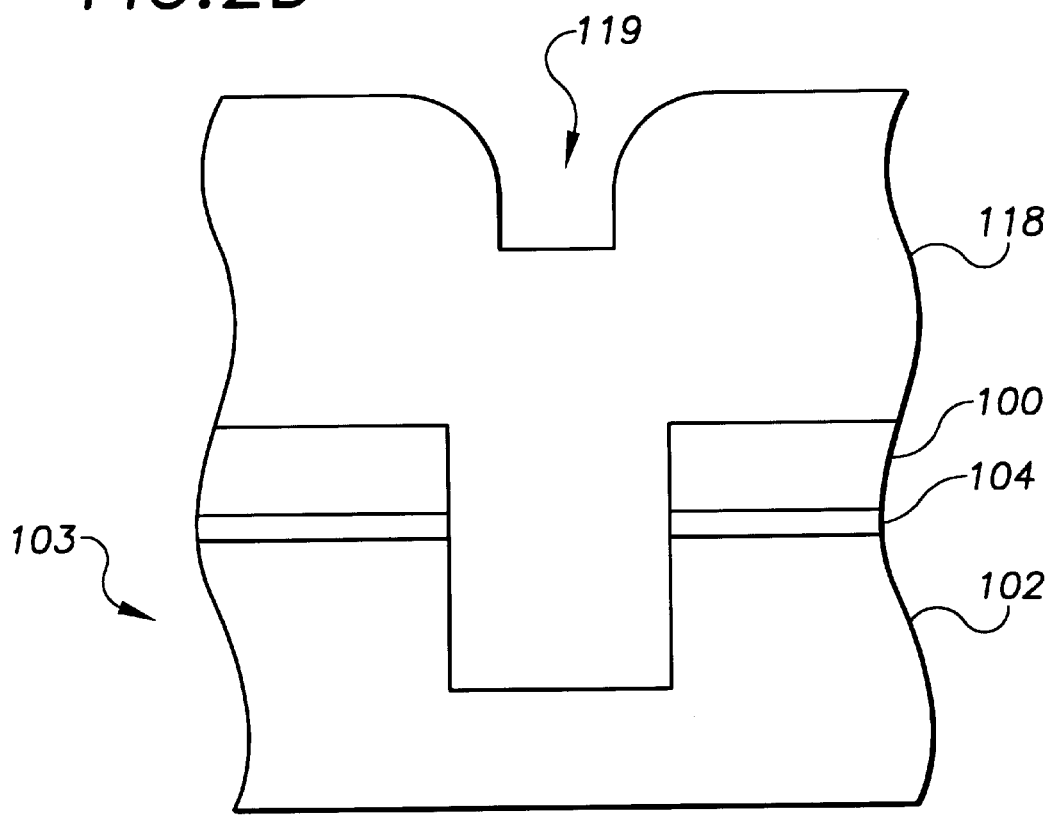

Another oxide layer 118 is formed to substantially fill the trench 110, as illustrated in FIG. 2D. For example, the oxide layer 118 may completely fill the trench and be about 3000–8000 angstroms thick. In some embodiments, the oxide layer 118 covers at least a portion of the masking layer 100.

The formation of the oxide layer 118 can be accomplished using well-known techniques, including, for example, chemical vapor deposition (CVD). One example of a suitable material for the formation of the oxide layer 118 is tetraethoxy silane (TEOS) which is converted to silicon dioxide during the CVD process. In some embodiments, the oxide layer 118 may be formed using two or more different materials.

Figure 2E:
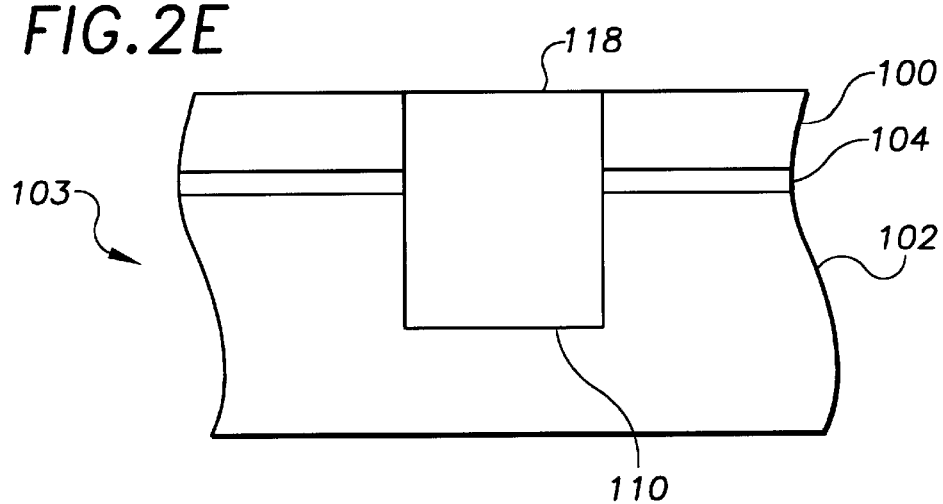

After formation of the oxide layer 118, a first portion of the oxide layer 118 is removed as illustrated in FIG. 2E. Often, removal of the first portion leaves the oxide layer 118 with a relatively planar surface. Removal of the first portion may be accomplished, for example, using known polishing techniques, such as chemical/mechanical polishing (CMP). Such methods may include chemical etching, physical abrasion, or a combination thereof. A portion of the masking layer 100 may also be removed during polishing. In some embodiments, the removal of the first portion of the oxide layer 118 leaves the oxide layer with a surface that is relatively planar with the masking layer 100. In other embodiments, the oxide layer 118 is under- or overpolished to provide a relatively planar oxide layer which protrudes or is slightly recessed with respect to the upper surface of the masking layer 100.

Figure 2F:
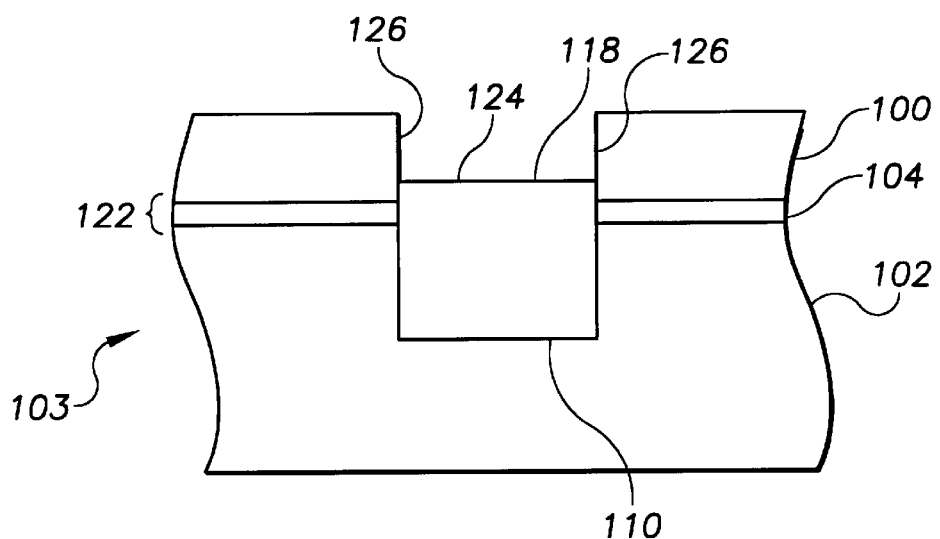

Following the removal of the first portion of the oxide layer 118, a second portion of the oxide layer 118 is removed, as illustrated in FIG. 2F, thereby leaving a remainder of the oxide layer 118 which has a relatively planar surface that is substantially recessed with respect to the masking layer 100. The removal of the second portion of the oxide layer 118 increases the planarity between the surface of the substrate 102 over the active regions 108 and the surface of the oxide layer 118 in the isolation regions 106. Typically, the oxide layer 118 is recessed by at least 10%, preferably at least 50%, more preferably at least 75%, and most preferably at least 90%, of the thickness of the masking layer 100.

Removal of the second portion of the oxide layer 118 can be achieved by a variety of techniques and methods. For example, the oxide layer 118 may be wet etched. Suitable wet etchants for this process include, for example, hydrofluoric acid in a 1:2–1:20 (acid:water) mixture with water which typically etches silicon dioxide preferentially over silicon nitride. Another removal technique is plasma or dry etching. In this case, $NF_3$ is one example of a suitable etchant.

A further technique, which is particularly useful, is anisotropic dry etching. This technique utilizes a combination of reactive plasma species and ion bombardment to etch the oxide layer 118. In anisotropic etching, the surface 124 of the oxide layer 118 is preferentially etched by direct bombardment of particles from the etching plasma. The sidewalls 126 of the masking layer 118 and the trench 110 are not bombarded as vigorously because fewer particles arrive from directions which intercept the sidewalls 126. Furthermore, a barrier layer often forms on the sidewalls 126, thereby preventing substantial etching. This is advantageous because the oxide layer 118 is preferentially etched, whereas the sidewalls 126 of the masking layer 100 are left largely untouched, particularly if the etchant is oxide selective. However, a portion of the masking layer 100 may be removed by the etchant without causing any deleterious effects.

One example of a suitable anisotropic etchant is a $CF_4$/$CHF_3$ plasma. The ratio of $CF_4$ to $CHF_3$ can be, for example, between about 1:1.5 to about 1:2.5. The plasma may also contain an inert gas, including, for example, argon, krypton, or neon.

This particular technique is advantageous because the amount of etching can often be correlated to the length of time that the oxide layer 118 is exposed to the etchant. The length of time necessary to remove a given amount of the oxide layer 118 typically depends on the particular etchant or combination of etchants and on the pressure and relative amounts of each etchant. Furthermore, an etchant can be chosen, if desired, which selectively etches the oxide layer 118 and leaves all or most of the masking layer 100. Typically, removal of the second portion of the oxide layer 118 by this method leaves a relatively planar surface.

Figure 2G:
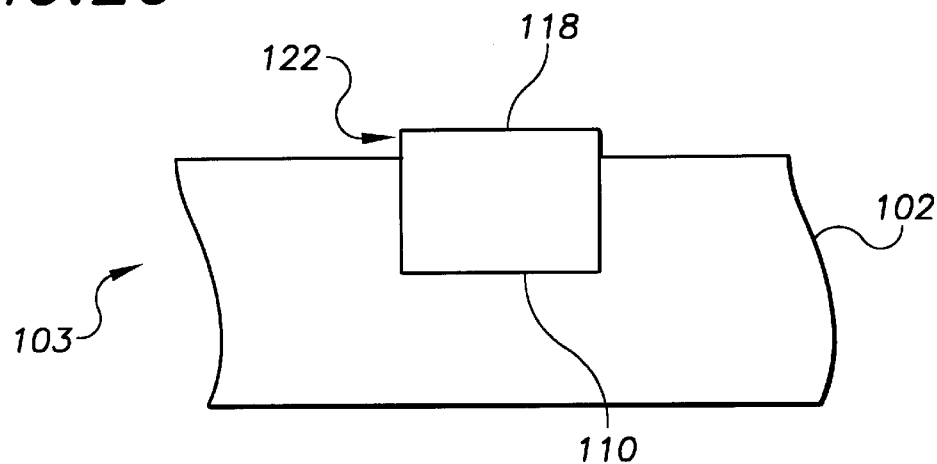

The masking layer 100 is removed, as shown in FIG. 2G, to expose the active regions 108 (e.g., source/drain) of the semiconductor wafer 103. The masking layer 100 may be removed using, for example, well-known techniques, such as wet-etching.

After removal of the masking layer 100, the oxide layer 118 may extend slightly above the surface of the substrate 102 resulting in a height differential 122. The height differential 122 typically depends on the amount of the oxide layer 118 removed by the previous procedure. In some embodiments, the height differential is, for example, about 900 angstroms or less, preferably, about 500 angstroms or less, more preferably, about 300 angstroms or less, and most preferably about 100 angstroms or less. In some cases, the height differential may be zero (i.e., the surface of the substrate and the surface of the remaining portion of the oxide layer are co-planar.)

Figure 1B:
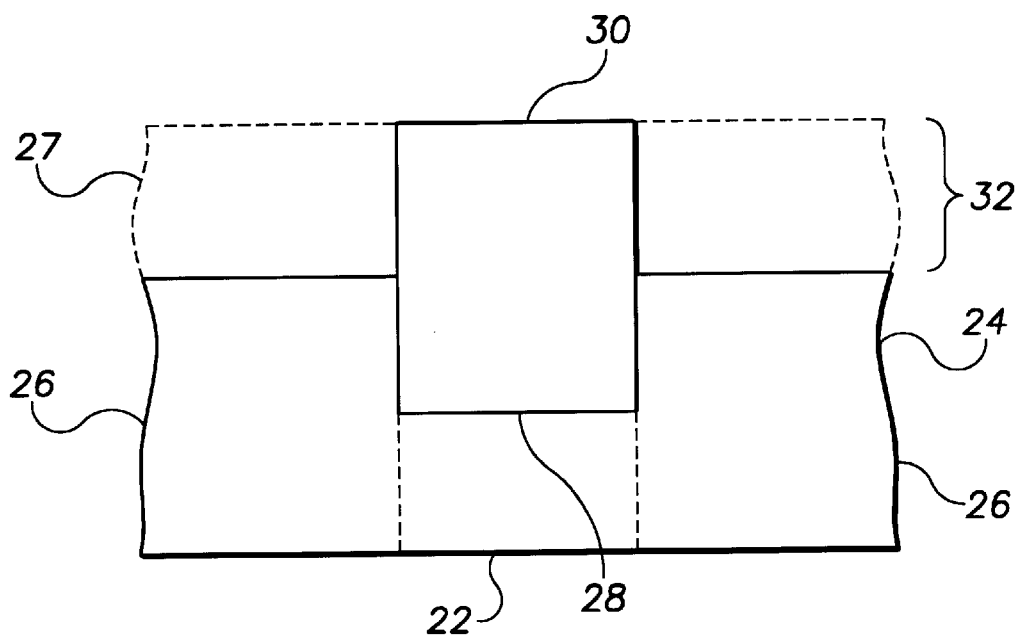
FIG. 1B illustrates a conventional trench isolation region in a typical semiconductor device.

Although a height differential 122 may be formed, the additional oxide removal step typically makes the surface of the resultant structure more planar than surfaces obtained by conventional techniques, (see FIG. 1B where the height differential 32 is approximately equal to the thickness of the masking layer 27). By increasing the planarity of the semiconductor device, later processing procedures may be simplified or require less critical tool because of the more uniformly planar surface. Such procedures may include, for example, the deposition of a polysilicon gate electrode layer followed by etching of portions of the polysilicon layer over active regions. During this process, the depth of focus requirement of the photolithography tool used for masking the polysilicon gate electrode layer can be reduced. Also, the polysilicon layer can be polished slightly to reduce the surface roughness.

FIGS. 3A–3F illustrate an exemplary process in accordance with another embodiment of the invention. In this embodiment, the steps and techniques described hereinabove in connection with FIGS. 2A–2D can be used to form a substrate 302 having a first masking layer 300, an insulating layer 304, one or more trenches 310, and an oxide layer 318 substantially filling the one or more trenches 310. The oxide layer 318 is often formed by chemical vapor deposition using a material such as TEOS, as described hereinabove. Chemical vapor deposition typically results in an oxide layer 318 which conformally maps the oxide layer 318 to the underlying surface structure. This typically results in the formation of divots 319 in the oxide layer 318 which generally correspond to the position of the trenches 310. These divots 319 may hinder formation of a relatively planar surface of the oxide layer 318.

Figure 3A:
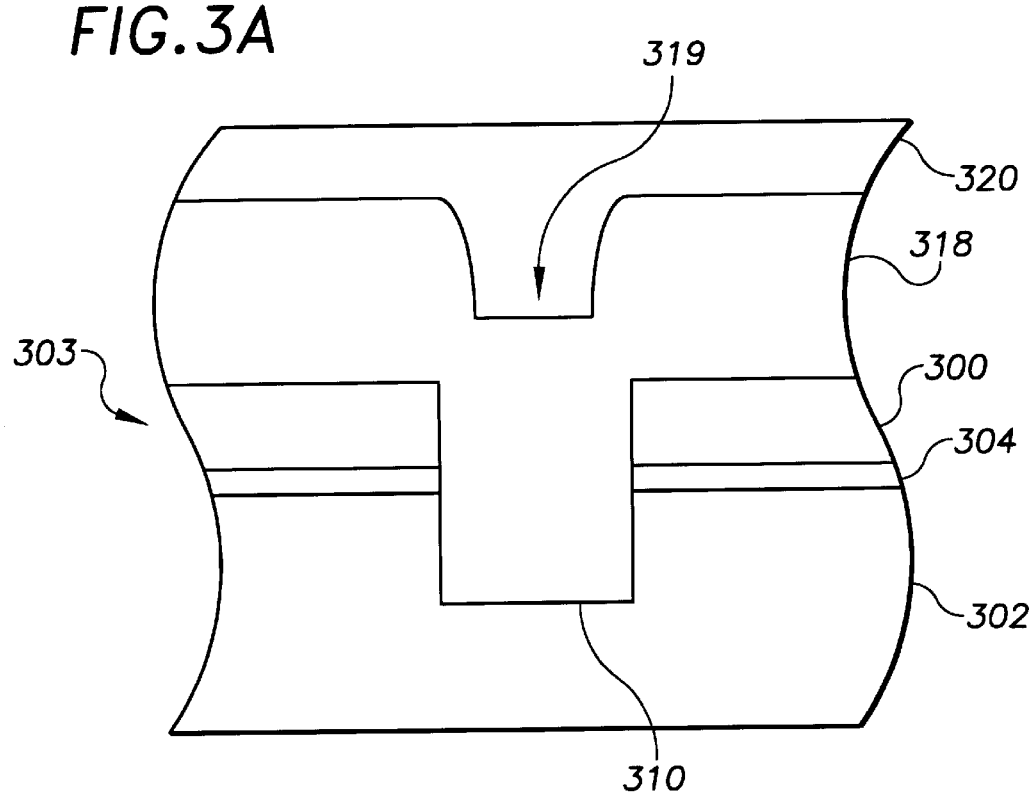
FIGS. 3A–3F illustrate an exemplary fabrication process in accordance with another embodiment of the invention.

To facilitate the formation of a relatively planar surface of the oxide layer 318, a second masking layer 320 is formed over the oxide layer 318, as shown in FIG. 3A. The second masking layer 320 is generally formed from a material selective to oxide such as photoresist or a nitride. In the example embodiment, the second masking layer 320 is a relatively thick (10000–20000 angstrom) layer of photoresist. The photoresist layer may, for example, be formed using conventional photolithography and etching techniques.

Figure 3B:
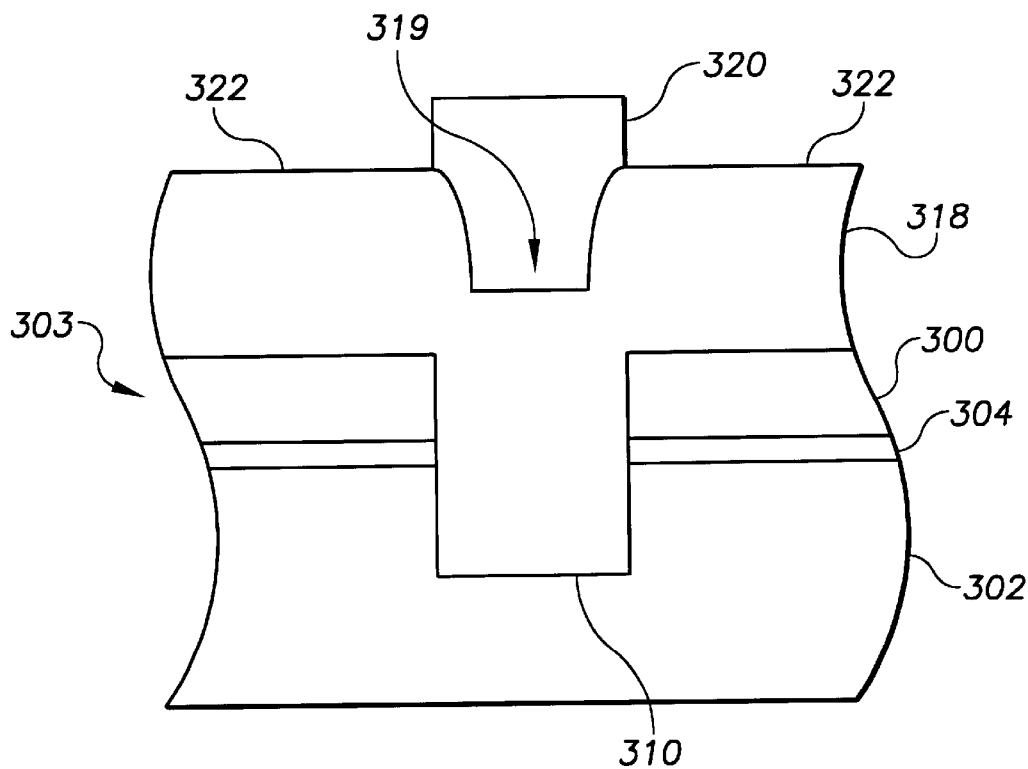

The second masking layer 320 is selectively removed so that the divots 319 remain covered and regions 322 of the oxide layer 318 adjacent the divot 319 are exposed, as illustrated in FIG. 3B. Selective removal of the second masking layer 320 may be accomplished by, for example, standard photolithography and etching techniques.

In some embodiments, the portions of the second masking layer 320 which are removed correspond, at least generally, to those portions of the first masking layer 300 which are buried beneath the oxide layer 318. One method of achieving this patterning of the second masking layer 320 is by photolithography using a resist mask that is the mirror image of a resist mask used to pattern the first masking layer 300.

Figure 3C:
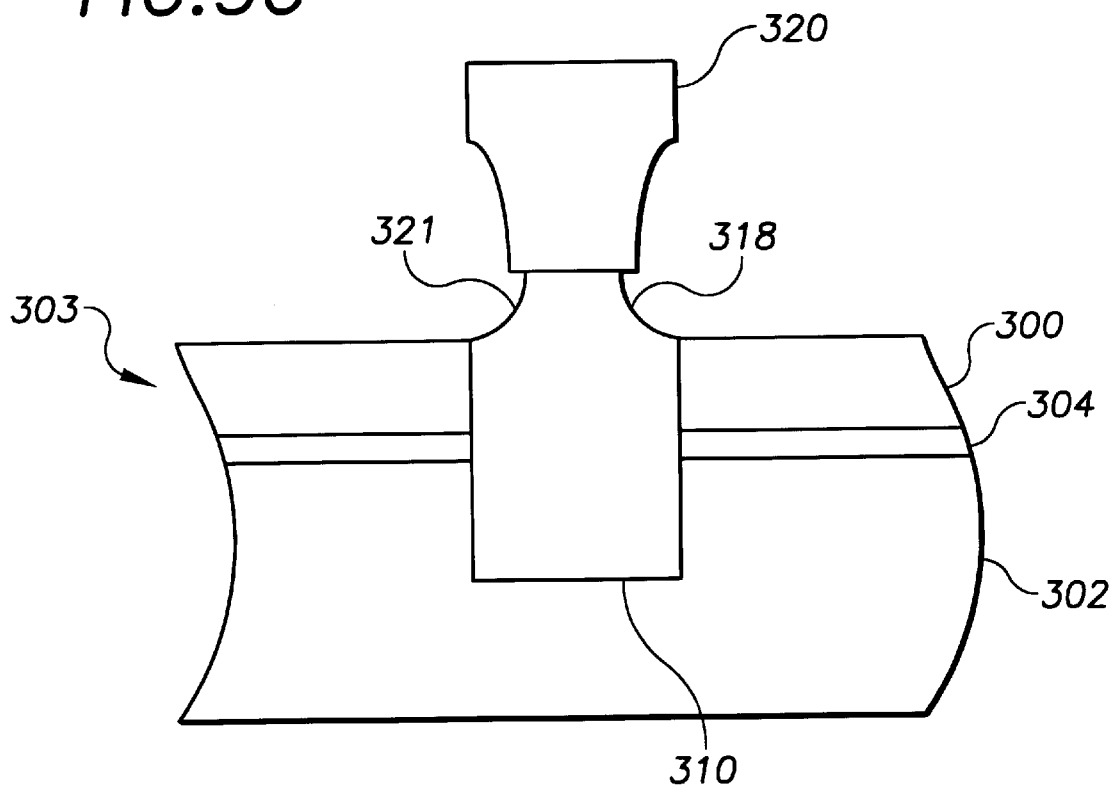

The exposed regions 322 of the oxide layer 318 are at least partially removed, as shown in FIG. 3C. Removal of the exposed regions 322 of the oxide layer 318 can be accomplished by a variety of techniques, including, for example, wet etching. In some embodiments, all or most of the oxide layer 318 in the exposed regions 322 is removed except for a portion 321 of the oxide layer 318 directly beneath the second masking layer 320, as depicted in FIG. 3C.

Figure 3D:
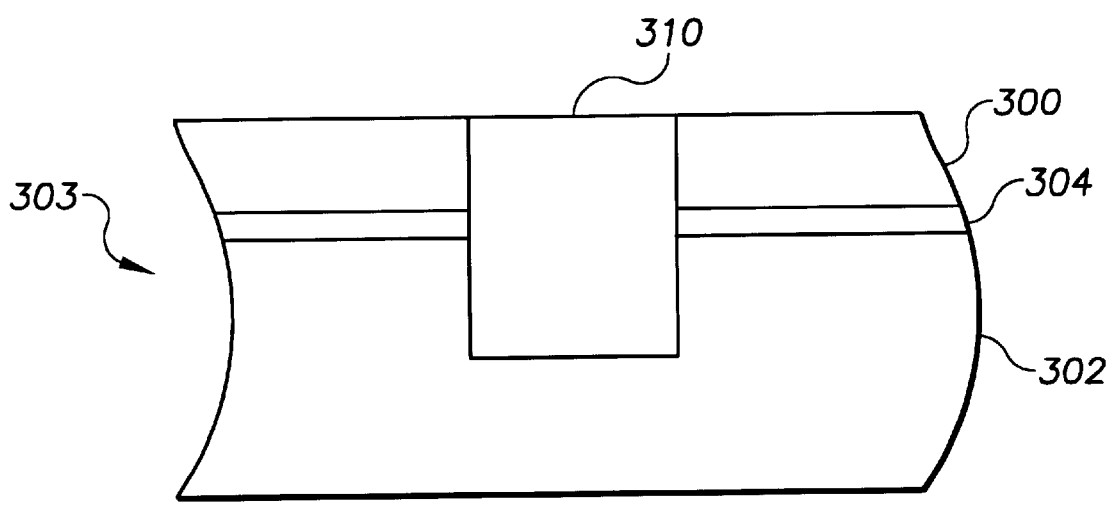

The second masking layer 320 is then removed and the oxide layer 318 planarized with the surface of the masking layer 320 as illustrated in FIG. 3D. The second masking layer 320 may be removed using, for example, standard techniques, such as etching. The oxide layer 318 may be planarized in a manner similar to that discussed above in connection with FIG. 2E.

Figure 3E:
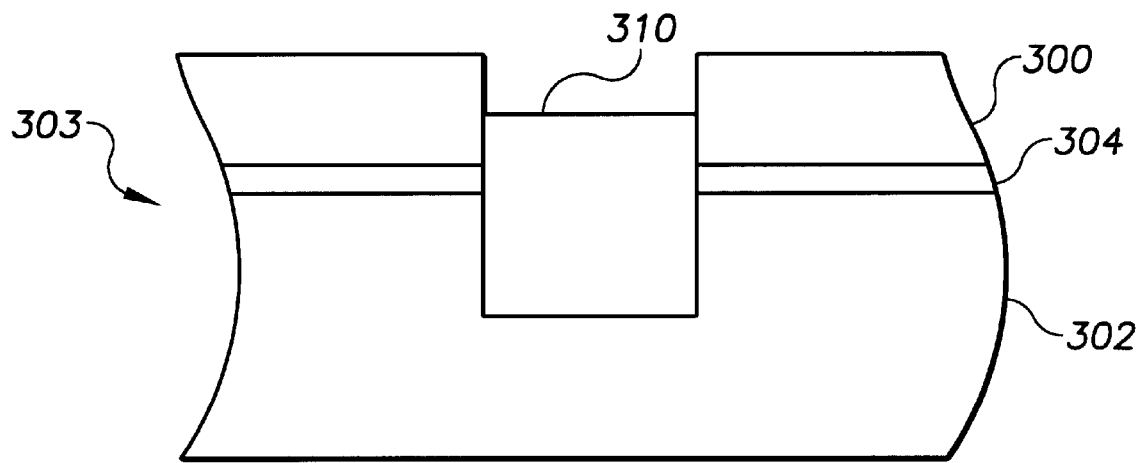
Figure 3F:
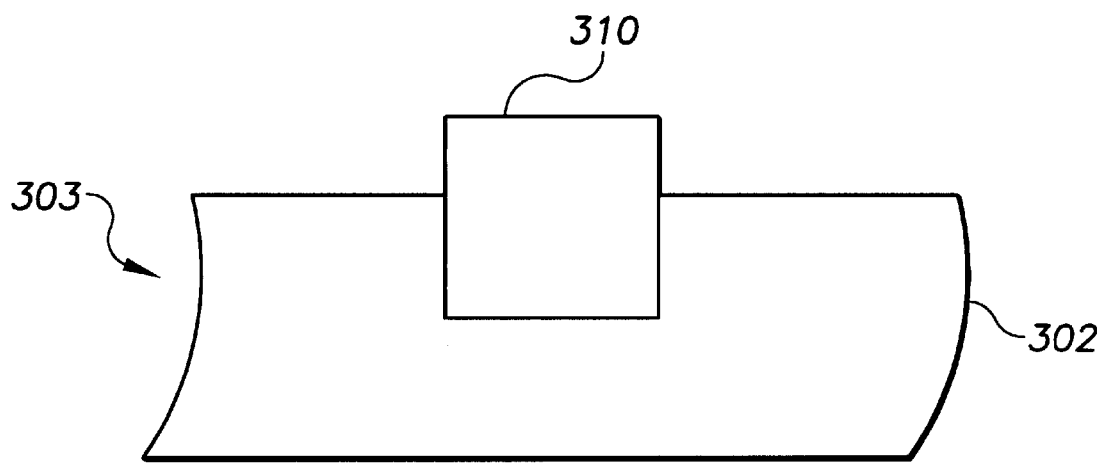

The steps described hereinabove in connection with FIGS. 2E–2G can then be used to remove additional portions of the oxide layer 318, as shown in FIG. 3E, and to remove the masking layer 300, as shown in FIG. 3F, to form a semiconductor device with an improved planar topography between the isolation regions and the active regions.

Using the above-described processes, trench isolation regions with improved planar topography relative to active regions can be formed in a semiconductor device. As noted above, the present invention is applicable to the fabrication of a number of different devices where an isolation region is formed in a substrate. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A method of making a semiconductor device, comprising steps of:
    forming a masking layer having a thickness on a surface of a substrate;
    selectively removing a portion of the masking layer to define one or more regions;
    forming at least one trench in the one or more regions;
    forming an oxide layer which substantially fills the at least one trench;
    via etching, removing a portion of the oxide layer and a portion of the masking layer to leave a remaining portion of the oxide layer which has a relatively planar surface that remains above the substrate surface and is recessed with respect to a remaining portion of the masking layer; and
    removing the masking layer to expose the substrate surface, wherein the substrate surface and the planar surface of the oxide layer have a height differential substantially less than the thickness of the masking layer, and the planar surface remains above the substrate surface.

2. The method of claim 1, wherein the height differential is less than half the thickness of the masking layer.

3. The method of claim 1, wherein the masking layer has a thickness between about 700 and about 2500 angstroms.

4. The method of claim 1, wherein the oxide layer comprises silicon dioxide.

5. The method of claim 1, wherein the step of forming the oxide layer comprises depositing the oxide layer by chemical vapor deposition.

6. The method of claim 1, wherein the step of removing a portion of the oxide layer comprises:
    removing a first portion of the oxide layer to planarize a surface of the oxide layer with the masking layer; and
    removing a second portion of the oxide layer to leave the remaining portion of the oxide layer which has a relatively planar surface that remains above the substrate surface and is recessed with respect to a remaining portion of the masking layer.

7. The method of claim 6, wherein the step of removing the first portion of the oxide layer comprises chemical/mechanical polishing of the oxide layer.

8. The method of claim 6, wherein step of removing the second portion of the oxide layer comprises etching the oxide layer.

9. The method of claim 8, wherein the step of etching the oxide layer comprises plasma etching the oxide layer.

10. The method of claim 8, wherein the step of etching the oxide layer comprises anisotropically etching the oxide layer.

11. The method of claim 8, wherein the oxide layer is etched using a fluorine-containing composition.

12. The method of claim 11, wherein the fluorine-containing composition comprises $CF_4$ and $CHF_3$.

13. The method of claim 1, wherein the height differential is about 500 angstroms or less.

14. A method of making a semiconductor device, comprising steps of:
    forming a masking layer having a thickness on a surface of a substrate;
    selectively removing a portion of the mask to define one or more regions;
    forming at least one trench in the one or more regions;
    forming an oxide layer which substantially fills the at least one trench;
    forming a second masking layer over the oxide layer;
    selectively removing a portion of the second masking layer to expose regions of the oxide layer;
    removing a portion of the exposed regions of the oxide layer;
    removing the second masking layer;
    removing a portion of the oxide layer to leave a remaining portion of the oxide layer which has a relatively planar surface that remains above the substrate surface and is recessed with respect to a remaining portion of the masking layer; and
    removing the masking layer to expose the substrate surface, wherein the substrate surface and the planar surface of the oxide layer have a height differential substantially less than the thickness of the masking layer, and the planar surface remains above the substrate surface.

15. A method of making a semiconductor device, comprising:
    forming a masking layer having a thickness on a surface of a substrate;
    selectively removing a portion of the masking layer to define one or more field regions;
    etching at least one trench in the one or more field regions;
    depositing an oxide layer which substantially fills the trench;
    polishing the oxide layer to remove a first portion of the oxide layer and form relatively planar surface with the masking layer;

etching the oxide layer and the masking layer to remove a second portion of the oxide layer and to leave a remaining portion of the oxide layer with a relatively planar surface that remains above the substrate surface and is recessed with respect to a remaining portion of the masking layer; and removing the masking layer to expose the substrate surface, wherein the substrate surface and the planar surface of the oxide layer have a height differential substantially less than the thickness of the masking layer, and the planar surface remains above the substrate surface.

16. A method of making a semiconductor device, comprising steps of:

forming a masking layer having a thickness on a surface of a substrate;

selectively removing a portion of the mask to define one or more regions;

forming at least one trench in the one or more regions;

forming an oxide layer which substantially fills the at least one trench;

forming a second masking layer over the oxide layer;

selectively removing a portion of the second masking layer to leave a remaining portion of the second masking layer only over the at least one trench;

removing a portion of the exposed regions of the oxide layer;

removing the second masking layer;

removing a portion of the oxide layer to leave a remaining portion of the oxide layer which has a relatively planar surface that remains above the substrate surface and is recessed with respect to a remaining portion of the masking layer; and removing the masking layer to expose the substrate surface, wherein the substrate surface and the planar surface of the oxide layer have a height differential substantially less than the thickness of the masking layer, and the planar surface remains above the substrate surface.

17. The method of claim 1, further comprising oxidizing portions of the substrate defining sidewalls of the at least one trench to form a thermal oxide layer prior to the step of forming the oxide layer which substantially fills the trench.

18. The method of claim 17, wherein the oxide layer is formed directly adjacent to the thermal oxide layer.

19. A method of making a semiconductor device, comprising:

forming a masking layer having a thickness on a surface of a substrate;

selectively removing a portion of the masking layer to define one or more regions;

etching at least one trench in the one or more regions;

thermally oxidizing a portion of the substrate defining at least one sidewall of the at least one trench to form a thermal oxide layer;

forming a second oxide layer which substantially fills the trench and is directly adjacent to the thermal oxide layer;

removing a first portion of the second oxide layer to planarize a surface of the second oxide layer with a remaining portion of the masking layer;

removing a second portion of the second oxide layer to leave a remaining portion of the second oxide layer which has a relatively planar surface that remains above the substrate surface and is recessed with respect to masking layer, wherein removing at least one of the first and second portions of the second oxide layer includes removing a portion of the masking layer; and removing the masking layer to expose the substrate surface, wherein the substrate surface and the planar surface of the second oxide layer have a height differential substantially less than the thickness of the masking layer, and the planar surface remains above the substrate surface.

* * * * *